United States Patent [19]

Liu et al.

[11] Patent Number: 4,653,054

[45] Date of Patent: Mar. 24, 1987

[54] REDUNDANT CLOCK COMBINER

[75] Inventors: Shao H. Liu, Norwalk; Joseph R. Yudichak, Madison, both of Conn.

[73] Assignee: ITT Corporation, New York, N.Y.

[21] Appl. No.: 722,894

[22] Filed: Apr. 12, 1985

[51] Int. Cl.[4] .................. G06F 1/04; G06F 11/20; H04Q 3/54

[52] U.S. Cl. ................................. 371/61; 371/8

[58] Field of Search ............. 371/61, 862; 179/18 EE; 307/269, 441, 442, 219

[56] References Cited

U.S. PATENT DOCUMENTS

| | | | |
|---|---|---|---|
| 4,081,662 | 3/1978 | Pehrson | 371/61 |
| 4,322,580 | 3/1982 | Khan | 371/61 |
| 4,392,226 | 7/1983 | Cook | 371/61 |
| 4,538,272 | 8/1985 | Edwards | 371/61 |
| 4,542,509 | 9/1985 | Buchanan | 371/61 |

Primary Examiner—Michael R. Fleming
Attorney, Agent, or Firm—Robert A. Hays; Peter C. Van Der Sluys

[57] ABSTRACT

A redundant clock combiner device includes a clock selecting latch that recovers a clock signal even if both externally supplied clocks fail. The clock selection occurs, and an output clock provided, even if the non-prioritized clock signal is restored before the prioritized clock signal.

10 Claims, 3 Drawing Figures

REDUNDANT CLOCK COMBINER

CROSS-REFERENCE TO RELATED APPLICATIONS

This application is related to the following United States Patent Applications: Ser. No. 682,030; Ser. No. 682,033; Ser. No. 682,034; Ser. No. 682,035; Ser. No. 682,228; Ser. No. 682,038 all filed on Dec. 14, 1984. All of the above applications are assigned to the assignee hereof.

BACKGROUND OF THE INVENTION

The present invention generally relates to a redundant clock combiner device and, in particular, relates to such a device that recovers a clock signal from either of two clocks after loss of both.

In many modern systems utilizing digital devices, the system is synchronized by a clock signal that is usually external to the system. The external clock signal, in one form or another, is provided to each device within the system requiring a clock signal, thus ensuring an internal clock mechanism for synchronous operation. In such a system, synchronous operation, among a plurality of digital devices, occurs unless, or until, the external clock signal is lost or the external clock source malfunctions. Such a loss or malfunction results in a temporary catastrophic failure of the desired synchronous operation of the system. For this reason, many such systems are provided with two clock signals from two different external clock sources, i.e. a redundant clock signal is provided. In order to make use of such a redundant clock signal, a redundant clock combiner or selector is provided to receive both of the externally supplied clock signals and select one of the clock signals for synchronizing the devices within the system.

In general, redundant clock combiner devices are usually based on either phased lock loop designs or on logic fall back designs. In the phased lock loop designs, the output clock to the system is phase locked to one of the externally supplied clock signals. If, for any reason, that externally supplied clock signal disappears, the output is slowly phase locked over to the other externally supplied clock signal. The phase lock loop designs are somewhat difficult to implement due to the analog circuitry.

In conventional logic fall back designs the incoming clock signals are initially compared to each other and if both are present, a preassigned one of the two is given priority. Usually, if the prioritized clock signal is lost, then the redundant clock combiner device digitally switches to the other clock signal. If the first, or prioritized, signal is restored and the second lost, then the redundant clock combiner device switches back to the prioritized signal. Difficulties arise, however, if both signals are lost. In such a situation, the conventional redundant clock combiner devices await the restoration of the prioritized signal and do not recover the clock signal if only the second, or non-prioritized, signal is restored.

Although the actual failure of an external clock would not normally occur frequently, clocks are frequently lost to a system when the system is being upgraded or repaired. Further, under such circumstances, it is not unusual for errors to be made in resuming the operation by restoring the wrong clock signal to the wrong port or in the wrong sequence. For example, the two clock signals may be simultaneously disconnected and the non-prioritized clock reconnected to the system before the prioritized signal that, for one reason or another, may need further work. Under such circumstances, a system using a conventional digital fall back clock combiner fails to recover the clock signal and does not resume synchronous operation until the prioritized signal is restored.

SUMMARY OF THE INVENTION

Accordingly, it is one object of the present invention to provide a redundant clock combiner device that recovers a clock signal subsequent to the loss of both externally supplied clock signals regardless of the clock signal initially restored.

This object is accomplished, at least in part, by a redundant clock combiner device having means for recovering a clock signal regardless of the external source thereof.

Other objects and advantages will become apparent to those skilled in the art from the following detailed description read in conjunction with the appended claims and the drawings attached hereto.

DETAILED DESCRIPTION OF THE INVENTION

Figure 1:
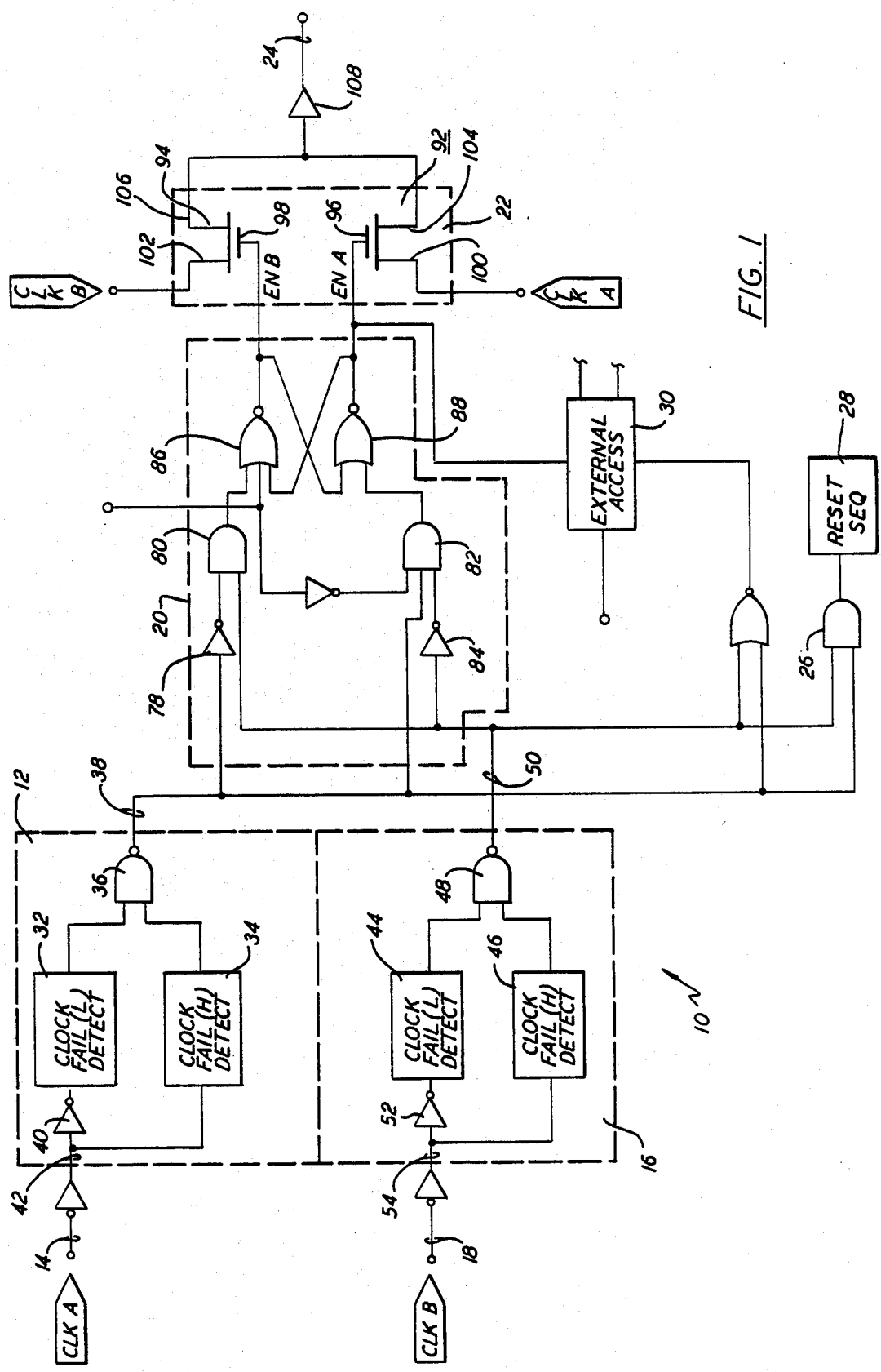
FIG. 1 is a block diagram of a redundant clock combiner device embodying the principles of the present invention.

A redundant clock combiner device, generally indicated at 10 in FIG. 1 and embodying the principles of the present invention, includes a means 12 for detecting the failure, or loss, of a first clock signal, CLK A, supplied to a first input port 14, a means 16 for detecting the failure, or loss, of a second clock signal, CLK B, supplied to a second input port 18, a means 20 for selecting one of the two clock signals, CLK A or CLK B, inputted to the device 10 and means 22 for enabling one of the clock signals, CLK A or CLK B, to be provided at an output port 24 of the device 10. In addition, in the preferred embodiment, the device 10 further includes means 26 for initializing a reset sequencer 28 and a means 30 for providing external access of the device 10.

In the embodiment shown in FIG. 1, the means 12 for detecting the failure of the clock at input port 14, includes a clock fail low detector 32 and a clock fail high detector 34 and a first logic gate 36. That is, a clock signal, usually a square wave, can fail at either of two voltage levels, high or low. Thus, the means, 12 and 16, must be capable of detecting either of two conditions. Preferably, the first logic gate 36 is a NAND gate having, as inputs thereto, the outputs from the detectors, 32 and 34, and an output, or AFAIL, line 38. The output or AFAIL line 38 changes binary level to indicate the change of one of the binary inputs thereto. As used herein the terms "binary LO" and "binary HI" are indicative of comparatively different voltage levels and are not specifically assigned voltages. In addition, the means 12 includes an inverter 40 between a common input line 42 and, for example, the clock fail low detector 32. The inverter 40 could also be positioned between the common input line 42 and the clock fail high detector 34. The common input line 42 connects to the input port 14 and sustains the first externally supplied clock signal CLK A. By such an arrangement the clock fail low detector 32, per se, can be made identical with the clock fail high detector 34.

Figure 2:
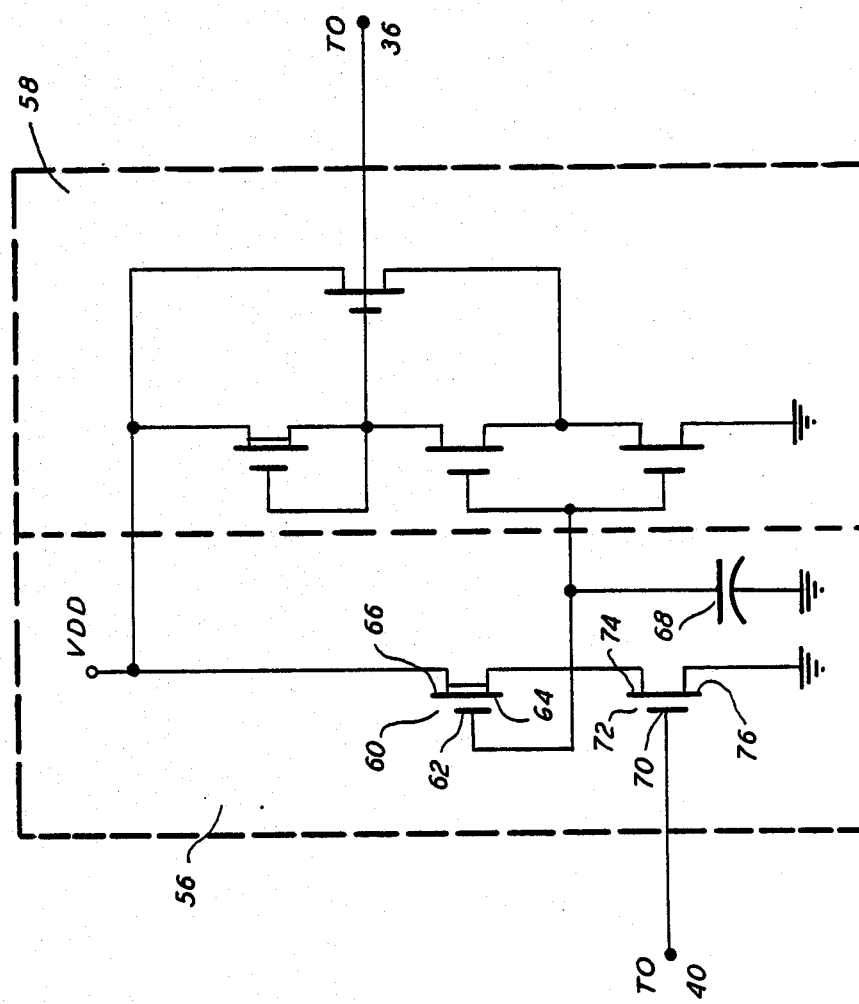
FIG. 2 is a schematic diagram of a means for detecting a clock failure useful in the device shown in FIG. 1.

Similarly, the means 14 for detecting the failure of the second clock signal, CLK B at the second input port 16 includes a clock fail low detector 44 and a clock fail high detector 46, a second logic gate 48, preferably a second NAND gate, having an output or BFAIL line 50, and an inverter 52 between the common input line 54 between the second input port 18 and the means 14. Thus, the means 14, is identical, in both hardware and function to the means 12. In the preferred embodiment, the clock fail detectors, 32, 34, 44 and 46, are virtually identical. For this reason, only the detailed diagram schematic of one of the clock fail detectors, 32, 34, 44 or 46, is shown in FIG. 2. As shown therein, each clock fail detector 32, 34, 44 and 46, includes an RC timing circuit 56 and a Schmitt trigger 58.

The RC timing circuit 56, in this embodiment, includes a depletion mode FET 60 having the gate 62 thereof connected to the source 64. In such a configuration the FET 60 is, effectively, a resistor. The drain 66 of the FET 60 is biased via a d.c. voltage $V_{DD}$, for example, about 5 volts. The source 64 is also connected to a capacitor 68.

In operation, for example, the input line 40 effectively monitors the CLK A signal. That is, the input line 40 is connected to the gate 70 of an enhancement FET 72 having its drain 74 connected to the source 64 of the FET 60 and the source 76 connected to a common ground. The FET 72, for so long as a clock pulse is present on the input line 40, acts as a low impedance, and maintains the Schmitt trigger 58 in the high voltage output state thereof. When the clock signal, CLK A, fails, i.e. the voltage on the gate 70 remains low, the impedance of FET 72 becomes high. As a result, during the RC time constant, i.e. via the "resistor" FET 60, the charge on the capacitor 68 increases until the Schmitt trigger 58 goes through a state transition whereupon the output thereof changes from a high voltage state to the low voltage state. This transition is effectively a change from a binary one, or HI state, to a binary low, or LO state. In the preferred embodiment, the time constant of the RC circuit 56 is made equal to about eight clock cycles to ensure that the clock signal being monitored has, in fact, failed. The time constant can, of course, be set to any practical time desired by the choice of the effective resistance of FET 60 and the value of capacitor 68. This allows for system stability in the event of spurious changes in the externally supplied clock signals, CLK A and CLK B.

As a consequence, the output, AFAIL line 38, from the NAND gate 36 changes from a binary LO to a binary HI indicating the failure of the externally supplied clock signal, CLK A, feeding the first input port 14. Thus, as more fully explained hereinafter, the changed output of the NAND gate 36 provides the necessary input to the clock selecting means 20 for the other externally supplied clock signal, CLK B, to be enabled by the means 22. In addition, the means 22 disables the failed clock signal, CLK A, from the output 24.

In the preferred embodiment, the means 20 for selecting a clock signal, CLK A or CLK B, has, as an input thereto, the AFAIL line 38 and the BFAIL line 50. The AFAIL line 38 is inverted by inverter 78 and inputted to a first AND gate 80 of the clock selecting means 20. The AFAIL line 38 is also directly inputted to a second AND gate 82 of the means 20. In a similar fashion, the BFAIL line 50 is directly inputted to the first AND gate 80 and is inverted by inverter 84, the inverted BFAIL signal being provided as an input to the second AND gate 82. Thus, under normal operating conditions, i.e. when both external clock signals, CLK A and CLK B, are present at the input ports, 14 and 18, respectively, the outputs from the first and second AND gates, 80 and 82, respectively, are both binary LO's.

The output from the first AND gate 80 serves as one input to a first NOR gate 86 and the output from the second AND gate 82 serves as one input to a second NOR gate 88. The output of the first NOR gate 86 serves as a second input to the second NOR gate 88 and the output of the second NOR gate 88 serves as a second input to the first NOR gate 86. The outputs of the NOR gates, 86 and 88, are, functionally, signals for enabling the respective clock signal, CLK B or CLK A, respectively, to be provided at the output 24 of the device 10. One of the outputs, i.e. EN A and EN B, from the NOR gates, 88 and 86, respectively, is normally a binary HI due to the cross coupling thereof.

In order to ensure that only one of the enabling outputs, EN A or EN B, in fact, enables an output a latch set/reset input is provided to the device 10 via signal line 90. The signal line 90 provided a direct input to the first NOR gate 86 and the inverted value thereof is inputted to the second AND gate 82. During system initialization a binary one, or HI, is injected to the means 20 via line 90. As a result, the EN B line is driven to a binary LO and the EN A line is a binary HI.

In operation, if clock pulses are received at both input ports, 14 and 16, i.e. there is no clock failure indicated, the means 20 retains the initial binary LO on the EN B line and the clock A is provided, via, for example, a non-inverting driver 108, at the output port 24. However, if clock A fails, the output from the NAND gate 36 changes from a binary LO to a binary HI. As a result, the AND gates 80 and 82, of the selecting means 20 change binary output values forcing clock A to be disabled and enabling clock B. However, if the clock B fails prior to the failure of clock A, the means 20 for selecting a clock pulse is unaffected and the clock signal from the clock A continues to be provided at the output port 24.

If clock A recovers, or is restored, after the failure of only that clock, the means 20 for selecting a clock remains in a state for enabling clock B, i.e. CLK B is enabled by means 22 and provided at the output 24. If, in any event, clock B fails, the second NAND gate 48 associated with port 18 changes from a binary LO to a binary HI, the AND gates, 80 and 82, of the clock selector means 22, forces the EN B line to a binary LO value, thus enabling clock A, i.e. EN A goes to a binary HI. Subsequently, if the B clock recovers, or is restored, the AND gate 82 changes from a binary HI back to a binary LO. Nevertheless, the means 20 remains in a state wherein EN B is a binary LO, i.e. the CLK A remains as the selected output.

In the event that both clocks fail, i.e. the outputs from both NAND gates, 36 and 48, reflect the failure, the state of the EN B line is inconsequential. If clock A recovers, or is restored first, then the AFAIL line 38 goes to a binary LO and the means 20 forces the EN B line low thereby selecting CLK A. If, however, clock B recovers, or is restored, first then the means 20 forces the EN A line to a binary LO, thus selecting clock B.

As shown in FIG. 1, the means 22 for enabling a clock pulse includes, in the preferred embodiment, a first and a second FET, 92 and 94, having the gates, 96 and 98 respectively, thereof connected, respectively, to the EN A and EN B lines, i.e. the outputs from the means 20 for selecting a clock. The sources, 100 and 102, of the FETs, 92 and 94, respectively, are connected to the externally supplied clock signals, CLK A and CLK B, respectively,. The drains, 104 and 106, of the FETs, 92 and 94, respectively, are joined and directed to the output port 24 via the non-inverting driver 108.

Figure 3:
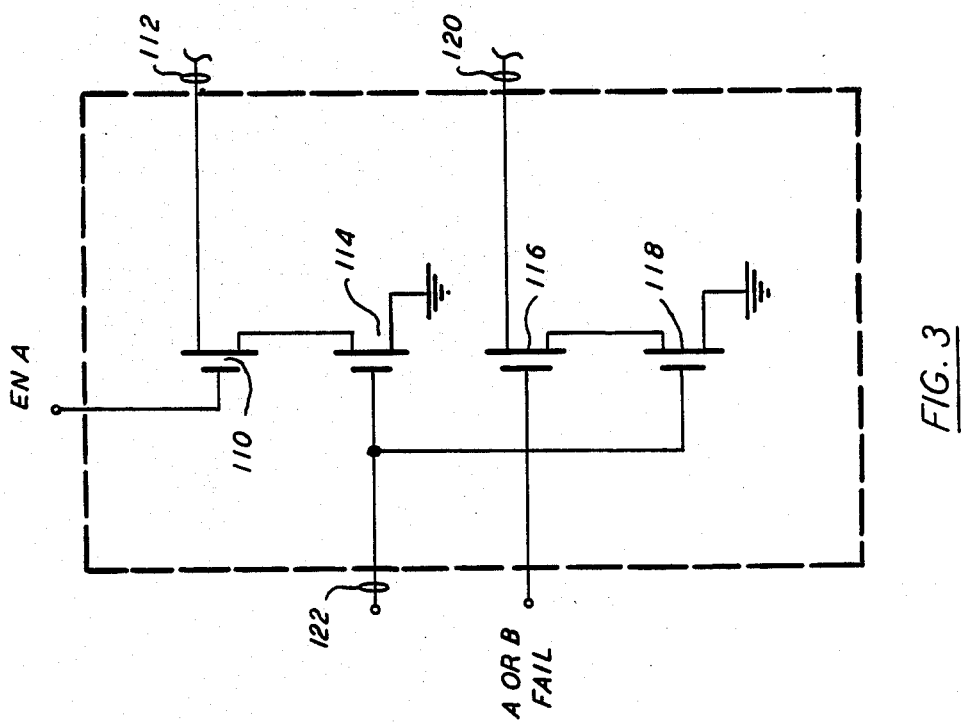
FIG. 3 is a circuit diagram of a means for externally accessing the device shown in FIG. 1.

In one preferred embodiment, the means 30 for externally accessing the device 10 includes a plurality of enhancement FET devices. For example, with reference to FIG. 3, a typical externally accessing means 30 is shown having a first input from the EN A line being provided to the gate of FET 110 the source thereof being a first output line 112 to, for example, a register and/or an alarm detecting device, not shown in the drawings. The drain of the first FET 110 is connected to the source of the second FET 114, the drain of which second FET 114 is grounded. Thus, the first and second FETs, 110 and 114, respectively provide an output that represents whether or not CLK A has failed. Essentially, the first and second FETs, 110 and 114 function as a logical NAND gate. A similar arrangement having an input representative of a failure of CLK A or CLK B as the input to the gate of a third FET 116 having the drain thereof connected to the source of a fourth FET 118. The source of the third FET 116 being a second output line 120 to an alarm registering device, not shown in the drawings. The second output line 120 is used to indicate whether or not either CLK A or CLK B has failed. The second and fourth FETs, 114 and 118, respectively, have the gates thereof connected to a read input line 122 from, for example, a microcomputer, not shown, controlling the operation of a system within which the present device 10 is incorporated. Thus, the third and fourth FETs, 116 and 118, also function as a logical NAND gate. In operation, the microprocessor can be adapted to read the alarm registers and access the two status indicators from the lines, 112 and 120. The status of the device 10 can thus be monitored at regular intervals to provide a historical record of any failures occurring in the device 10 or, more particularly, the externally provided clock sources.

The reset sequencer 28 is adapted to ensure that all devices throughout a system are in a predetermined logical state in response to both power-up and reset signals. As generally known in the art, in order to start, or restart, the operation of a plurality of cooperative digital devices the logic gates within that system must be set to a particular logic state. This is generally referred to as the initialization of the system. Thus, when both CLK A and CLK B fail, the system is forced to undergo a reset sequence upon the restoration of one of the clock signals, CLK A or CLK B. Since the logical state of various devices depend upon the logical state of other devices, the initialization is usually executed according to a predetermined set of steps, i.e. a sequence.

In the preferred embodiment the entire device 10, inter alia, is fabricated using known Large Scale Integrated (LSI) circuit techniques and all FETs are of the NMOS type.

Although the present invention has been described herein with regard to an exemplary embodiment other arrangements or configurations may be developed that, nevertheless, do not depart from the scope of the present invention. Thus, the present invention is deemed limited only by the appended claims and the reasonable interpretation thereof.

What is claimed is:

1. A redundant clock combiner device having a plurality of externally supplied clock signals provided thereto, said device comprising:
    means, connected in series with each said externally supplied clock signals, for detecting the failure thereof said failure detecting means having an output that changes binary states when a failure is detected, said detecting means also having means for detecting said clock failure when said failure occurs during a comparatively higher voltage clock portion thereof, and means for detecting said clock failure when said failure occurs during a comparatively lower voltage clock portion thereof; and
    means, connected to said failure detecting means and having said output therefrom as an input, for selecting the first operative one of said externally supplied clock signals, said selection means enabling said first operative one of said clock signals subsequent to the failure of all said externally supplied clock signals.

2. Device as claimed in claim 1 wherein the input to said clock high voltage failure detecting means is the binary inverse of the input to said clock low voltage failure detecting means.

3. Device as claimed in claim 2 wherein all said clock failure detecting means in said device are identical.

4. Device as claimed in claim 3 wherein each said clock failure detecting means includes an RC timing circuit and a Schmitt trigger.

5. Device as claimed in claim 4 wherein said RC timing circuit has a characteristic time delay about equal to eight clock pulses.

6. Device as claimed in claim 1 wherein each said detecting means further comprising:
    a first logic gate having, as inputs thereto, the outputs of said higher voltage and lower voltage clock failure detecting means whereby the output of said logic gate executes a binary state transition in response to the failure of said clock signal associated therewith.

7. Device as claimed in claim 6 wherein said output of said first logic gates of said detecting means are provided as input signals to said selecting means.

8. Device as claimed in claim 1 further comprising:
    means, connected to an output of said selecting means, for enabling said external clock signals selected by said clock selecting means to be delivered to an output of said device.

9. Device as claimed in claim 8 further comprising:
    means, connected to another output of said selecting means, for disabling said externally supplied clock signals not selected by said selecting means.

10. Device as claimed in claim 1 further comprising:
    means for initializing a reset sequencer, said reset sequencer initialization means being an AND gate having as inputs thereto, the output from said failure detecting means.

* * * * *